(12) United States Patent
Schmidt et al.

(10) Patent No.: US 11,489,519 B2
(45) Date of Patent: Nov. 1, 2022

(54) ANALOG SWITCH WITH BOOST CURRENT FOR FAST TURN ON

(71) Applicant: Texas Instruments Incorporated, Dallas, TX (US)

(72) Inventors: Thomas Alan Schmidt, Plano, TX (US); Sean Patrick McEnroe, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/377,349

(22) Filed: Jul. 15, 2021

(65) Prior Publication Data

US 2022/0021380 A1 Jan. 20, 2022

Related U.S. Application Data

(60) Provisional application No. 63/053,890, filed on Jul. 20, 2020.

(51) Int. Cl.
H03K 17/04 (2006.01)
H03K 17/042 (2006.01)
H03K 17/06 (2006.01)
H03K 19/017 (2006.01)

(52) U.S. Cl.
CPC ....... *H03K 17/04* (2013.01); *H03K 17/04206* (2013.01); *H03K 17/063* (2013.01); *H03K 19/017* (2013.01)

(58) Field of Classification Search
CPC ................. H03K 17/04; H03K 17/042; H03K 17/04206; H03K 17/06; H03K 17/063; H03K 19/017; H03K 19/01
See application file for complete search history.

(56) References Cited

U.S. PATENT DOCUMENTS

2020/0127658 A1\* 4/2020 Campbell ............ H03K 17/161

\* cited by examiner

*Primary Examiner* — Jung Kim
(74) *Attorney, Agent, or Firm* — John R. Pessetto; Charles A. Brill; Frank D. Cimino

(57) ABSTRACT

An analog switch includes an input terminal, an output terminal, a common gate, and a common source. The switch includes a current source which has a first input coupled to a first voltage supply, a control input coupled to receive a gate boost signal, and an output coupled to the common gate. The current source supplies a boost gate current to the common gate during a boost period and supplies a reduced gate current during a second period different than the boost period. The switch includes a clamp circuit which has a first terminal coupled to the common gate, a second terminal coupled to the common source, and a third terminal. The switch includes a Vgs detection circuit which provides the gate boost signal responsive to a conduction of current through the clamp circuit.

22 Claims, 4 Drawing Sheets

ANALOG SWITCH WITH BOOST CURRENT FOR FAST TURN ON

CROSS REFERENCE TO RELATED APPLICATION

This application claims priority to U.S. Provisional Application No. 63/053,890, filed Jul. 20, 2020, entitled "Fast Gate Turn On with Full VGS Detect", which is hereby incorporated by reference in its entirety.

TECHNICAL FIELD

This description relates generally to analog switches.

BACKGROUND

Analog signal switches are used to aggregate inputs and outputs from multiple sources into a signal chain for processing. For example, in a commercial HVAC system, input signals from several temperature sensors may be multiplexed via an analog switch into a single amplifier or an analog-to-digital (A/D) converter. Reducing the turn on time of an analog switch and enhancing its "on" resistance flatness to reduce errors in a signal chain are desired.

SUMMARY

In one aspect, an analog switch includes a first transistor which has a first terminal coupled to an input voltage terminal, a second terminal coupled to a common source, and a control terminal coupled to a common gate. The switch includes a second transistor which has a first terminal coupled to an output voltage terminal, a second terminal coupled to the common source, and a control terminal coupled to the common gate. The switch includes a current source which has a first input coupled to a first voltage supply, a control input coupled to receive a gate boost signal, and an output coupled to the common gate. The current source supplies a boost gate current to the common gate terminal during a boost period and supplies a reduced gate current after the boost period. The switch includes a clamp circuit which has a first terminal coupled to the common gate, a second terminal coupled to the common source, and a third terminal. The clamp circuit applies a clamp voltage across the common gate and the common source. The switch includes a gate to source voltage (Vgs) detection circuit which has a first terminal coupled to the third terminal of the clamp circuit and a second terminal to be coupled to a second voltage supply. The Vgs detection circuit provides the gate boost signal.

In an additional aspect, the gate boost signal has a logic low state when current conducts through the clamp circuit and has a logic high state in the absence of a conduction of current through the clamp circuit.

In an additional aspect, the current source supplies the boost gate current to the common gate terminal responsive to the gate boost signal having a logic high state and removes the boost gate current responsive to the gate boost signal having a logic low state. The current source supplies the reduced current to the common gate terminal responsive to the gate boost signal having a logic low state.

In an additional aspect, a third transistor is coupled between the common gate and the second voltage supply. The third transistor connects the common gate to the second voltage supply when the third transistor is turned on and disconnects the common gate from the second voltage supply when the third transistor is turned off. A fourth FET is coupled between the common source and the low voltage terminal. The fourth transistor connects the common source to the second voltage supply when the fourth transistor is turned on and disconnects the common source terminal from the second voltage supply when the fourth transistor is turned off.

In an additional aspect, the current source includes a first current mirror which has a first terminal coupled to receive a first reference current and a second terminal coupled to the second voltage supply. The first current mirror provides a first mirrored current. The current source includes a second current mirror which has a first terminal coupled to the first voltage supply and a second terminal coupled to receive the first mirrored current. The second current mirror provides the gate current to the common gate.

In an additional aspect, the current source includes a seventh transistor which has a source coupled to the first current mirror, a drain coupled to the second current mirror, and a gate coupled to receive an enable signal. The seventh transistor couples the first current mirror to the second mirror responsive to the enable signal.

In an additional aspect, the current source includes a boost current circuit which has a first terminal coupled to the drain of the seventh transistor, a second terminal coupled to receive the first reference current, and a third terminal coupled to the second voltage supply. The boost current circuit includes a lower transistor which has a gate coupled to receive the first reference current, a drain, and a source coupled to the second voltage supply. The boost current circuit includes an upper transistor which has a gate coupled to receive the gate boost signal, a drain coupled to the second current mirror, and a source coupled to the drain of the lower transistor.

In an additional aspect, the clamp circuit includes an eighth transistor which has a drain coupled to the common gate, a gate coupled to the drain, and a source. The clamp circuit includes a source follower transistor which has a source coupled to the source of the eighth transistor, a gate coupled to the common source, and a drain coupled to the second voltage supply.

In an additional aspect, the Vgs detection circuit includes a current mirror which has a first terminal coupled to the drain of the source follower transistor, a second terminal coupled to the second voltage supply, and a third terminal. The Vgs detection circuit includes an inverter which has an input coupled to the third terminal of the current mirror and an output configured to provide a Vgs detect signal. The Vgs detection circuit includes a mono-shot circuit which has an input coupled to receive the enable signal and an output to provide a mono-shot signal. The Vgs detection circuit includes a logic NOR gate which has a first input coupled to receive the mono-shot signal and a second input coupled to receive the Vgs detect signal. The logic NOR gate provides the gate boost signal.

In an additional aspect, an analog switch includes a first field-effect transistor (FET) which has a first terminal coupled to an input voltage terminal, a second terminal coupled to a common source, and a control terminal coupled to a common gate. The switch includes a second FET which has a first terminal coupled to an output voltage terminal, a second terminal coupled to the common source, and a control terminal coupled to the common gate. The switch includes a current source which has a first input coupled to a first voltage supply, a control input coupled to receive a gate boost signal, and an output coupled to the common gate. The current source supplies a boost gate current to the common gate during a boost period and supplies a reduced gate current during a second period different than the boost period. The switch includes a third FET coupled between the common gate and a second voltage supply. The third FET connects the common gate to the second voltage supply when the third FET is turned on and disconnects the common gate from the second voltage supply when the third FET is turned off. The switch includes a fourth FET coupled between the common source and the second voltage supply. The fourth FET connects the common source to the second voltage supply when the fourth FET is turned on and disconnects the common source terminal from the second voltage supply when the fourth FET is turned off. The switch includes a clamp circuit which has a first terminal coupled to the common gate, a second terminal coupled to the common source, and a third terminal. The clamp circuit applies a clamp voltage between the common source and the common gate and biases the first and second FETs to enhance an on resistance flatness of the analog switch. The switch includes a Vgs detection circuit which has a first terminal coupled to the third terminal of the clamp circuit and a second terminal coupled to the second voltage supply. The Vgs detection circuit provides the gate boost signal responsive to the conduction of current through the clamp circuit.

In an additional aspect, an analog switch includes an input terminal, an output terminal, a common gate, and a common source. The switch includes a current source which has a first input coupled to a first voltage supply, a control input coupled to receive a gate boost signal, and an output coupled to the common gate. The current source supplies a boost gate current to the common gate during a boost period and supplies a reduced gate current during a second period different than the boost period. The switch includes a clamp circuit which has a first terminal coupled to the common gate, a second terminal coupled to the common source, and a third terminal. The clamp circuit applies a clamp voltage between the common source and the common gate. The switch includes a Vgs detection circuit having a first terminal coupled to the third terminal of the clamp circuit and a second terminal coupled to a second voltage supply. The Vgs detection circuit provides the gate boost signal responsive to the conduction of current through the clamp circuit.

BRIEF DESCRIPTION OF THE DRAWINGS

The same reference numbers or other reference designators are used in the drawings to designate the same of similar (functionally and/or structurally) features.

DETAILED DESCRIPTION

Figure 1:
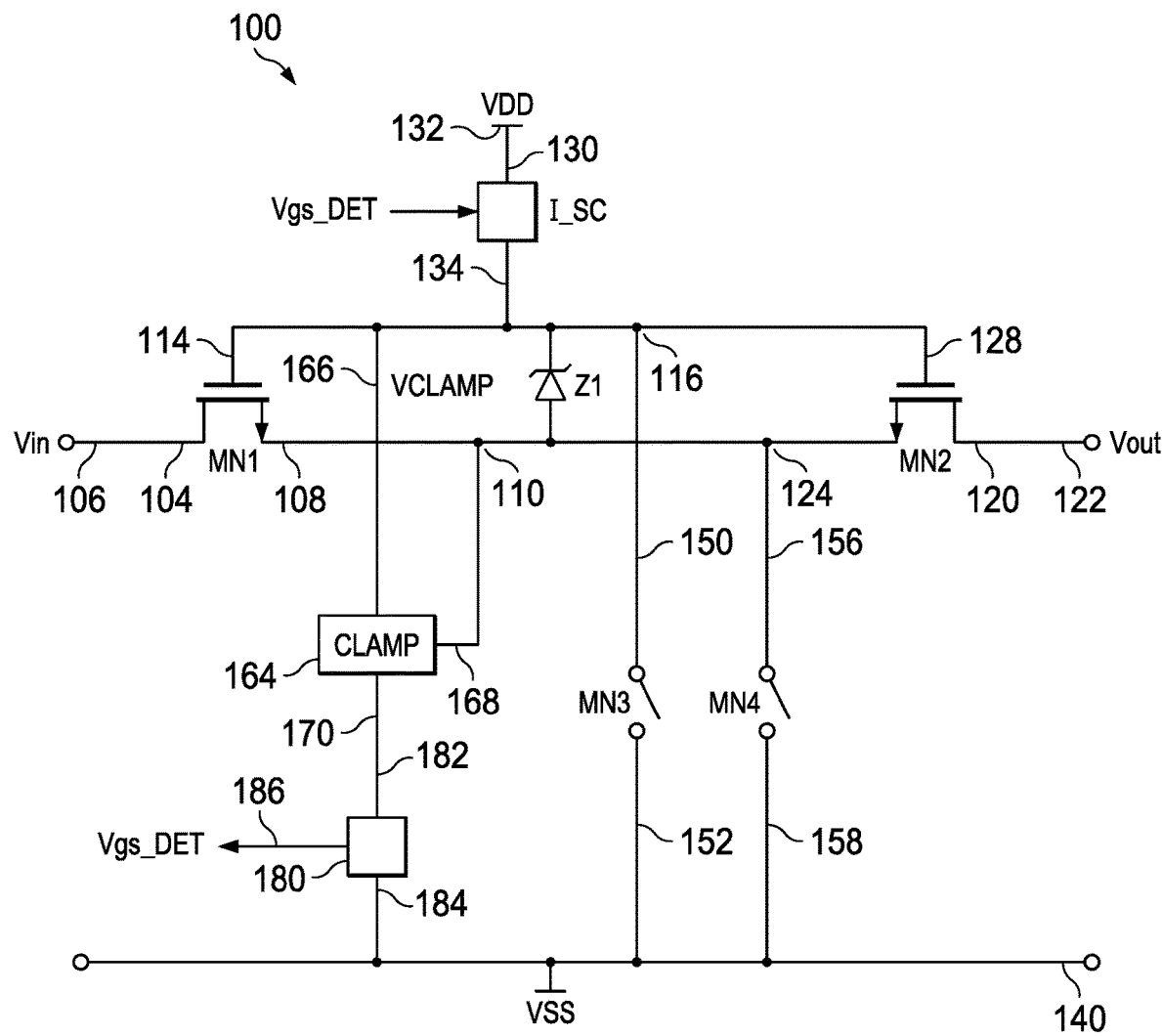
FIG. 1 is a circuit diagram of an analog switch of an example embodiment.

FIG. 1 is a circuit diagram of an analog switch 100 of an example embodiment. The analog switch 100 can be used, for example, to aggregate inputs and outputs from multiple sources into a signal chain or to multiplex inputs from multiple sources.

As discussed in more detail below, the switch 100 includes a current source I_SC which provides a boost current to a common gate (e.g., node 116) of the switch 100 during an initial boost period and thereafter provides a reduced current to the common gate. By providing the boost current to the common gate during the initial boost period, the time required to turn on the switch 100 (i.e., propagation delay) is reduced. The switch 100 includes a clamp circuit which tracks an input voltage Vin. In an example embodiment, the input voltage Vin is tracked indirectly by sensing the voltage at a common source (e.g., node 110) of the switch 100. The input voltage Vin is used as a reference to generate a floating gate to source voltage. The floating gate to source voltage, which is also referred to as a clamp voltage VCLAMP, is applied between the common gate and the common source of the switch 100 to bias the switch 100. The clamp circuit increases the range of an on-resistance "Ron" flatness of the switch 100 while biasing the switch 100 with a low gate to source voltage Vgs. An advantage of biasing the switch 100 with a low gate to source voltage Vgs is that a charge pump is not required to turn on the switch 100, which reduces die area required to fabricate the switch 100 in a semiconductor integrated circuit (IC) (e.g., switch 100 can be implemented on a single semiconductor die). In other example embodiments, the switch 100 can be biased with a higher gate to source voltage Vgs (e.g., 5V, 12V) and a charge pump may or may not be utilized.

The switch 100 includes a first field-effect transistor (FET) MN1 which has a first terminal 104 (e.g., drain) coupled to an input voltage terminal 106, and a second terminal 108 (e.g., source) coupled to a first common terminal 110 (referred to as the common source 110). The FET MN1 has a control terminal 114 (e.g., gate) which is coupled to a second common terminal 116 (referred to as the common gate 116). The switch 100 includes a second FET MN2 which has a first terminal 120 (e.g., drain) coupled to an output voltage terminal 122, and a second terminal 124 (e.g., source) coupled to the common source 110. The FET MN2 has a control terminal 128 (e.g., gate) which is coupled to the common gate 116. In an example embodiment, MN1 and MN2 are high voltage FETs which are coupled back to back, i.e., the sources of the FETs MN1 and MN2 are coupled together.

The input terminal 106 can be coupled to an input voltage Vin. In response to Vin, the switch 100 provides an output voltage Vout at the output terminal 122. As discussed in more detail below, when the analog switch 100 is turned on, the switch 100 acts as a "pass-through" circuit by forwarding the input voltage Vin from the input terminal 106 to the output terminal 122. The switch 100 can be used, for example, to multiplex inputs from multiple sources.

The switch 100 includes the current source I_SC which has an input 130 coupled to a high voltage terminal 132, and an output 134 coupled to the common gate 116. The high voltage terminal 132 can be coupled to a high voltage supply VDD (e.g., 24V). In an example embodiment, VDD is higher than the oxide breakdown voltage of MN1 and MN2.

The current source I_SC supplies a boost current (e.g., 550 uA) to the common gate 116 initially during a boost period, and thereafter supplies a reduced gate current (e.g., 55 uA) to the common gate 116 responsive to a Vgs detect signal Vgs_DET. By supplying the boost current initially, the time required to turn on (i.e., propagation delay) the first and second FETs MN1 and MN2 and to transition to a Miller region is reduced. (The Miller region is sometimes referred to as the Miller Plateau where the gate to source voltage Vgs of the FET is relatively flat.)

In an example embodiment, when the voltage between the common gate 116 and the common source 110 reaches VCLAMP and the signal Vgs_DET is asserted, the current source I_SC reduces the gate current supplied to the common gate 116.

In an example embodiment, MN1 is an n-channel field effect transistor (NFET) which has the drain 104, the source 108, and the gate 11, and MN2 is an NFET which has the drain 120, the source 124, and the gate 128. The sources 108 and 124 are coupled to the common source 110, and the gates 114 and 128 are coupled to the common gate 116. In other embodiments, the transistors illustrated in FIG. 1 may be bipolar junctions transistors (such as NPN or PNP), p-channel FETs, NFETs, high-voltage transistors, low-voltage transistors and/or any combination thereof.

The switch 100 includes a third NFET MN3 coupled between the common gate 116 and a low voltage terminal 140 (e.g., ground). The NFET MN3 couples the common gate 116 to the low voltage terminal 140 when MN3 is closed (i.e., turned on) and disconnects the common gate 116 from the low voltage terminal 140 when MN3 is opened (i.e., turned off).

In an example embodiment, the low voltage terminal 140 can be coupled to a low voltage supply VSS (e.g., 0V, −24V) via a diode (not shown in FIG. 1). In other embodiments, the low voltage terminal 140 can be coupled directly to VSS.

The switch 100 includes a fourth NFET MN4 coupled between the common source 110 and the low voltage terminal 140 (e.g., ground). The NFET MN4 couples the common source 110 to the low voltage terminal 140 when MN4 is closed (i.e., turned on) and disconnects the common gate 110 from the low voltage terminal 140 when MN4 is opened (i.e., turned off).

The switch 100 includes a clamp circuit 164 which has a first terminal 166 coupled to the common gate 116, a second terminal 168 coupled to the common source 110, and a third terminal 170. The switch 100 includes a Vgs detection circuit 180 which has a first terminal 182 coupled to the third terminal 170 of the clamp circuit 164, and has a second terminal 184 coupled to the low voltage supply terminal 140. In response to a conduction of current through the clamp circuit 164, the Vgs detection circuit 180 provides the Vgs detect signal Vgs_DET and the clamp circuit 164 applies the clamp voltage VCLAMP between the common gate 116 and the common source 110. As explained below, the clamp voltage VCLAMP biases MN1 and MN2 and protects MN1 and MN2 from being damaged. In an example embodiment, VCLAMP is set at a level adequate (e.g., less than 3.0V or 2.5V) to bias the gate to source voltages of MN1 and MN2 within a safe operating voltage range (i.e., Vgs) of MN1 and MN2.

In an example embodiment, a Zener diode Z1 is connected between the common source 110 and the common gate 116. As discussed in more detail below, the Zener diode Z1 provides over-voltage protection to the switch 100.

Figure 2A:
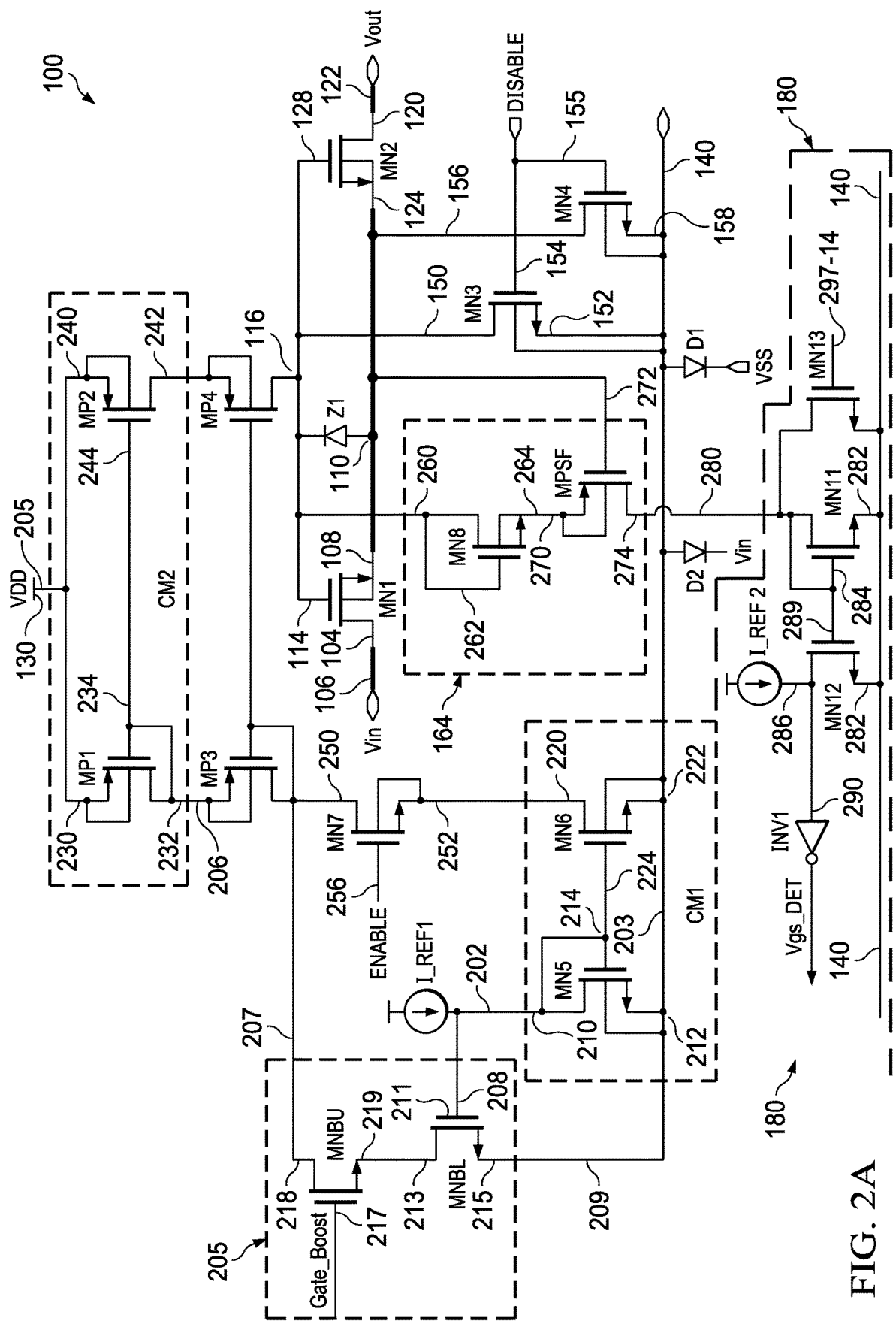
FIGS. 2A-2B are schematic diagrams of an analog switch of an example embodiment.

FIG. 2A is a schematic diagram of the switch 100 of an example embodiment. The switch 100 includes the NFET MN1 which has the drain 104, the source 108, and the gate 114. The switch 100 includes the NFET MN2 which has the drain 122, the source 124, and the gate 128. The sources 108 and 124 are coupled to the common source 110, and the gates 114 and 128 are coupled to the common gate 116.

The switch 100 includes the NFET MN3 which has the drain 150 coupled to the common gate 116 and has the source 152 coupled to the low voltage terminal 140. The switch 100 includes the NFET MN4 which has the drain 156 coupled to the common source 110 and has the source 158 coupled to the low voltage terminal 140. The NFETs MN3 and MN4 have respective gates 154 and 155 coupled to receive a disable signal DISABLE.

In an example embodiment, the low voltage terminal 140 is coupled to the low voltage supply VSS via a diode D1 and also coupled to the input voltage Vin via a diode D2. The diodes D1 and D2 jointly form a "Diode OR" which sets the anodes of D1 and D2 at a voltage level approximately equal to the lower of Vin or VSS. The effect of this is the switch 100 can be turned off when VSS<Vin and also when Vin<VSS by pulling the common source 110 to the lower of Vin and VSS and prevent body diodes from Vin to VSS (not shown in FIG. 2) from conducting.

The current source I_SC includes a first current mirror CM1 which has a first terminal 202 coupled to receive a first reference current I_REF1 (coupled, for example, to a voltage supply, such as VDD, at one terminal) and a second terminal 203 coupled to the low voltage terminal 140. The first current mirror CM1 provides a first mirrored current. In an example embodiment, the first current mirror CM1 includes a fifth NFET MN5 which has a drain 210 coupled to receive I_REF1, and has a source 212 coupled to the low voltage supply terminal 140. The NFET MN5 has a gate 214 coupled to the drain 210. The first current mirror CM1 includes a sixth NFET MN6 which has a drain 220, a source 222 coupled to the low voltage supply terminal 140, and a gate 224 coupled to the gate 214 of MN4. The sixth NFET MN6 mirrors the current which flows through MN5. In some embodiments, the mirrored current is a multiple of the current passing through MN5, where the multiple is determined based on the sizing of transistors MN5 and MN6. In some embodiments (such as that depicted in FIG. 2A), the backgates (or body contact) of transistors MN5 and MN6 are connected to the sources 212 and 222.

The current source I_SC includes a second current mirror CM2 which has a first terminal 205 coupled to the high voltage terminal 130 and a second terminal 206 coupled (via MP3 and MP7) to the first current mirror CM1. The second current mirror CM2 provides the gate current to the common gate 116. In an example embodiment, the second current mirror CM2 includes a first p-channel field effect transistor (PFET) MP1 which has a source 230 coupled to the high voltage terminal 130, a drain 232, and a gate 234 coupled to the drain 232. The second current mirror CM2 includes a second PFET MP2 which has a source 240 coupled to the high voltage terminal 130, a drain 242 coupled to the common gate 116, and a gate 244 coupled to the gate 234 of the PFET MP1. The second PFET MP2 mirrors current through the first PFET MP1 and supplies the gate current to the common gate 116 via a PFET MP4. In some embodiments, the mirrored current is a multiple of the current passing through MP1, where the multiple is determined based on the sizing of transistors MP1 and MP2. In some embodiments (such as that depicted in FIG. 2A), the backgates (or body contact) of transistors MP1 and MP2 are connected to the sources 230 and 240.

The current source I_SC includes the seventh NFET MN7 which has a drain 250 coupled to the drain 232 of the first PFET MP1 via the PFET MP3, and a source 252 coupled to the drain 220 of the sixth NFET MN6. The seventh NFET MN7 has a gate 256 coupled to receive an enable signal ENABLE. In response to the enable signal ENABLE being asserted (e.g., a higher voltage if transistor MN7 is an NFET), the NFET MN7 couples the sixth NFET MN6 to the first PFET MP1 via a PFET MP3.

The current source includes a boost current circuit 221 which has a first terminal 207 coupled to the drain 250 of the NFET MN7, a second terminal 208 coupled to the drain 210 of MN5, and a third terminal 209 coupled to the low voltage terminal 140. In an example embodiment, the boost current circuit 221 includes a lower NFET MNBL which has a gate 211 coupled to receive I_REF1, a drain 213, and a source 215 coupled to the low voltage terminal 140. The boost current circuit 221 includes an upper NFET MNBU which has a gate 217 coupled to receive a boost gate signal Gate_Boost, a drain 218 coupled to the drain 250 of MN7, and a source 219 coupled to the drain 213 of the lower NFET MNBL.

Because the gates 211 and 214 of MNLB and MN5, respectively, are interconnected and the sources 215 and 212 of MNBL and MN5, respectively, are interconnected, the current through MN5 is mirrored by MNBL. In an example embodiment, MNBL is sized so that current through MN5 is mirrored by MNBL by a factor of, for example, 50 or 100.

In some implementations, in order to protect MP2 by preventing a voltage VDD-VSS from being applied to MP2, the PFETs MP3 and MP4 are utilized to couple the second current mirror CM2 to the common gate 116. The PFET MP4 is coupled between the PFET MP2 and the common gate 116, and the PFET MP3 is coupled between the PFET MP1 and the NFET MN7. Thus, the second current mirror CM2 is coupled to the common gate 116 via the PFET MP4, and the second current mirror CM2 is coupled to the first current mirror CM1 via the PFET MP3 and the NFET MN7.

Because the gates 214 and 224 of MN5 and MN6, respectively, are interconnected and the sources 212 and 222 of MN5 and MN6, respectively, are interconnected, the current through MN5 is mirrored by MN6. Because the gates 211 and 214 of MNLB and MN5, respectively, are interconnected and the sources 215 and 212 of MNLB and MN5, respectively, are interconnected, the current through MN5 is mirrored by MNBL.

In an example embodiment, MN5, MN6 and MNBL are sized so that current through MN5 is mirrored by MN6 by a factor of 10, and current through MN5 is mirrored by MNBL by a factor of 50 or 100. For example, if 1 uA flows through MN5, then 10 uA flows through MN6 and 100 uA flows through MNBL. Thus, 100 uA flows through MNBL if 1 uA flows through MN6.

In order to turn on the switch 100: (1) the disable signal DISABLE is deasserted (e.g., a low voltage is applied to the gates 154 and 155 of the respective FETs MN3 and MN4 when MN3 and MN4 are NFETs); (2) the enable signal ENABLE is asserted (e.g., a higher voltage is applied to the gate 217 of the FET MN7 when MN7 is an NFET); and (3) Vgs_DET is low. As a result, the common gate 116 and the common source 110 are disconnected from the low voltage terminal 140, and the drain 232 of MP1 is coupled to the drain 220 of MN6 (through MP3) and to the drain 218 of MNBU. The current flowing through MP1 is the sum of the current flowing through MN6, and MNBL. Thus, if 1 uA flows through MN5, 10 uA flows through MN6, 100 uA flows through MNBL, and 110 uA flows through MP1. In an example embodiment, the disable signal DISABLE and the enable signal ENABLE can be generated by a microcontroller or by user inputs.

In an example embodiment, MP1 and MP2 are sized so that the current through MP1 is mirrored by a factor of 5 by MP2. Thus, if 110 uA flows through MP1, approximately 550 uA flows through MP2. As a result, approximately 550 uA gate is current supplied to the common gate 116 by MP2 through MP4, which causes the gate to source voltages (Vgs) of MN1 and MN2 to rise. When the gate to source voltages of MN1 and MN2 rise above a threshold Vt required to turn on MN1 and MN2 (i.e., MN1 and MN2 are in the Miller region), MN1 and MN2 conduct, causing the input voltage Vin to appear at the common source 110 (and also at the output 122). As MN1 and MN2 continue to conduct and enter the Rds enhancement region, the voltage at the common gate 116 rises again. In response, the clamp circuit 164 applies a clamp voltage VCLAMP across the common gate 116 and the common source 110, which prevents the voltage across the common gate 116 and the common source from rising above VCLAMP.

In an example embodiment, the clamp circuit 164 includes an NFET MN8 which has a drain 260 coupled to the common gate 116, and a gate 262 coupled to the drain 260. The NFET MN8 has a source 264. The clamp circuit 164 includes a source follower PFET MPSF which has a source 270 coupled to the source 264 of the FET MN8, and a gate 272 coupled to the common source 110. The source follower PFET MPSF has a drain 274 coupled to the low voltage terminal 140 through an NFET MN11.

As the voltage at the common gate 116 rises, the voltage at the source 270 of the source follower MPSF also rises, which causes the source to gate voltage (Vsg) of the source follower MPSF to rise above a threshold voltage required to turn on the source follower PFET MPSF.

Since the common gate 116 is connected to the drain 260 of MN8 and the common source 110 is connected to the gate 272 of MPSF (due to the conduction of the source follower MPSF) the voltage between the common gate 116 and the common source 110 is clamped by the sum of the drain/gate to source voltage of MN8 (i.e., voltage between the shorted drain/gate and the source of MN8, sometimes referred to as a diode connected NFET) and the source to gate voltage of MPSF. The sum of the drain to source voltage of MN8 and the source to gate voltage of MPSF is referred to as the clamp voltage VCLAMP. The clamp circuit 164 clamps the voltage between the common gate 116 and the common source 110 to VCLAMP, which prevents further rise of the voltage at the common gate 116. The clamp voltage VCLAMP is set at a level lower than a secondary overvoltage protection limit (e.g., 6.5V), but higher than the threshold voltage Vt necessary to allow MN1 and MN2 to conduct. By clamping the voltage between the common gate 116 and the common source 110 at VCLAMP, the clamp circuit 164 prevents damage to the FETs MN1 and MN2 and also biases the FETs MN1 and MN2 so they can conduct. In an example embodiment, VCLAMP is set less than 3.0V (e.g., approximately 2.5V).

A Zener diode Z1 is connected between the common source 110 and the common gate 116. The Zener diode Z1 has an anode connected to the common source 110 and has a cathode connected to the common gate 116. The Zener diode Z1 provides the secondary over-voltage protection in both the positive direction when the switch 100 is turned on and also in the negative direction (source to gate) when MN3 and MN4 turn-on when the switch 100 is disabled (i.e., MN1 and MN2 are turned off).

The switch 100 includes the Vgs detection circuit 180 coupled between the drain 274 of the FET MPSF and the low voltage terminal 140. The Vgs detection circuit 180 provides the Vgs detection signal Vgs_DET responsive to the conduction of current through MPSF.

In an example embodiment, the Vgs detection circuit 180 includes an NFET MN11 which has a drain 280 coupled to the drain 274 of the PFET MPSF, a source 282 coupled to the low voltage terminal 140, and a gate 284 coupled to the drain 280. The Vgs detection circuit 180 includes an NFET MN12 which has a drain 286 coupled to receive a reference current I_REF2 (e.g., 1 uA), a source 282 coupled to the low voltage supply terminal 140, and a gate 289 coupled to the gate 284 of the NFET MN11. Because the NFETs MN11 and MN12 are coupled in a current mirror configuration, the current through the NFET MN11 is mirrored by the NFET MN12. In an example embodiment, the NFETs MN11 and MN12 are sized such that the current through MN11 is mirrored by MN12 by a factor of 0.1. If, for example, 10 uA flows through MN11, 1 uA flows through MN12. In an example embodiment, a filter (e.g., capacitive filter not shown in FIG. 2A) can be coupled between the drain 286 and the source 282 of MN12.

As discussed before, in order to turn on the switch 100, the disable signal DISABLE is deasserted, and the enable signal ENABLE is asserted. Before the voltage across the common gate 116 and the common source 110 rises above the threshold voltage required to turn on the NFETs MN1 and MN2, the clamp circuit 164 does not conduct current. Thus, the NFETs MN11 and MN12 does not conduct current. As a result, the drain 286 of the NFET MN12 is pulled to a logic high state due to current source I_REF2 and its connection to the high voltage terminal 130. The Vgs detection circuit 180 includes an inverter INV1 which has an input 290 coupled to the drain 286 of the NFET MN12. Responsive to the drain 286 of the NFET MN12 pulled to a logic high state, the inverter INV1 provides the Vgs detection signal Vgs_DET which has a logic low state. In some example embodiments, the inverter INV1 can be a Schmitt trigger to allow for deglitching of signals through the Schmitt trigger.

When the voltage between the common gate 116 and the common source 110 rises above the threshold voltage required to turn on the NFETs MN1 and MN2, the clamp circuit 164 conducts current. Thus, the NFET MN11 conducts current, and, because the NFETs MN11 and MN12 are coupled in a current mirror configuration, the NFET MN12 also conducts current, which causes the drain 286 of the NFET MN12 to be pulled to a logic low state. As a result, the inverter INV1 provides the Vgs detect signal Vgs_DET which has a logic high state.

Figure 2B:
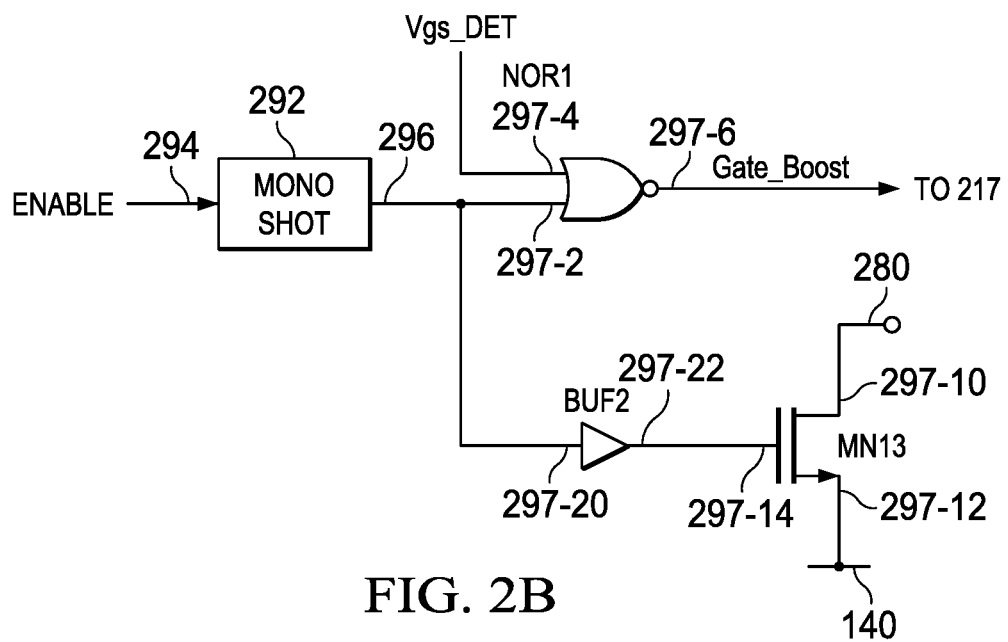

In an example embodiment, the Vgs detection circuit 180 includes a mono-shot circuit 292 which is illustrated in FIG. 2B. The mono-shot circuit 292 has an input 294 coupled to receive the enable signal ENABLE. The mono-shot circuit 292 is a mono-stable circuit that provides a mono-shot signal MONO_SHOT at an output 296. The mono-shot signal MONO_SHOT has a logic low state only for a predetermined period (i.e., mono-shot window) and thereafter rises to a logic high state (i.e., stable state). In an example embodiment, the logic low state of the mono-shot signal MONO_SHOT indicates the maximum duration (e.g., 3 us, 5 us) the boost current is applied to the common gate 116. In some example embodiments, the maximum duration is set (at the time of fabrication or subsequent testing) based on device and/or system requirements or can be set during operation of the switch 100.

The Vgs detection circuit 180 includes a logic NOR gate NOR1 which has a first input 297-2 coupled to receive the mono-shot signal MONO_SHOT and a second input 297-4 coupled to receive the Vgs_DET signal. The logic NOR gate NOR1 provides a Gate_Boost signal at an output 297-6. The Gate_Boost signal is applied to the gate 217 of the FET MNBU. When the Gate_Boost signal is high, the FET MNBU is turned on, thus activating the boost current circuit 221. As a result, the boost current is supplied to the common gate 116. When the Gate_Boost signal is low, the FET MNBU is turned off, thus disabling the boost current circuit 221. As a result, the boost current is removed from the common gate 116.

As discussed before, prior to the voltage across the common gate 116 and the common source 110 rising above the threshold voltage required to turn on the NFETs MN1 and MN2, the clamp circuit 164 does not conduct, resulting in a logic low state for the Vgs detect signal Vgs_DET. Because the output of the logic NOR gate NOR1 (i.e., Gate_Boost) has a logic high state only if MONO_SHOT and Vgs_DET have both logic low states, the Gate_Boost signal is truncated by the Vgs detect signal Vgs_DET due to the operation of the logic NOR gate NOR1. The effect of this is when the clamp circuit 164 conducts current, which indicates that the voltage across the common gate 116 and the common source 110 has risen above the threshold voltage required to turn on MN1 and MN2, the FET MNBU is turned off, thus removing the boost current from the common gate 116.

The Vgs detection circuit 180 includes an NFET MN13 (shown in FIG. 2A and in FIG. 2B) which has a drain 297-10 coupled to the drain 280 of the NFET MN11. The NFET MN13 has a source 297-12 coupled to the low voltage terminal 140. The NFET MN13 has a gate 297-14. The Vgs detection circuit 180 includes a buffer BUFF1 which has an input 297-20 coupled to receive the mono-shot signal MONO_SHOT and has an output 297-22 coupled to the gate 297-14 of the NFET MN13. The mono-shot signal MONO_SHOT is buffered by the buffer BUFF1 and applied to the gate 297-14 of the NFET MN13. When the mono-shot signal MONO_SHOT transitions to a logic high state (stable state), the NFET MN13 is turned on, thus shorting the drain 280 and the source 282 of the NFET MN11. The effect of this is the Vgs detection circuit 180 is disabled. The boost current is applied to the common gate 116 until the voltage between the common gate 116 and the common source 100 reaches the threshold voltage and thereafter the boost current is removed.

Figure 3:
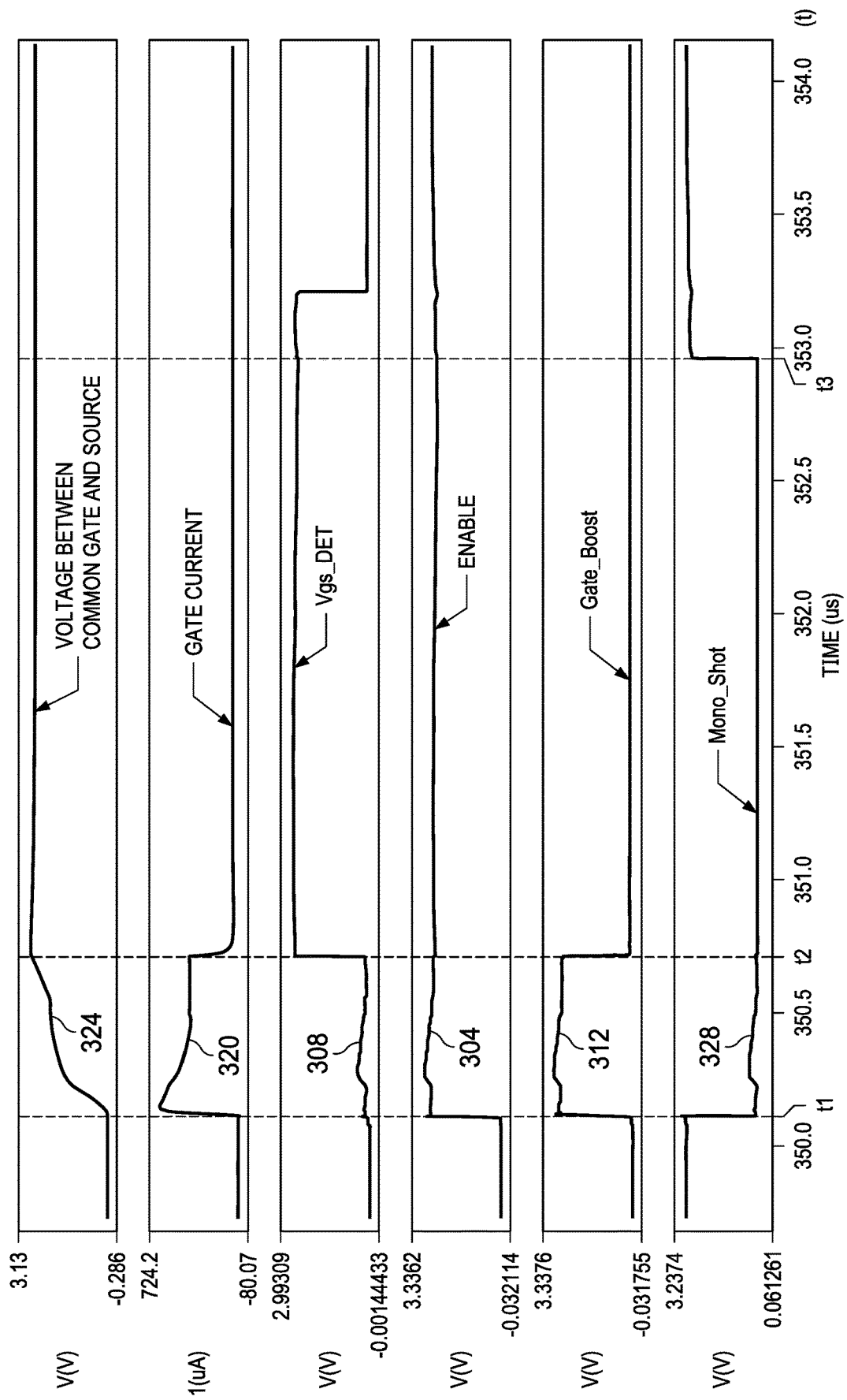
FIG. 3 illustrates simulated waveforms in an analog switch of an example embodiment.

FIG. 3 are simulated waveforms in the switch 100. The x-axis represents time and the y-axis represents voltage/current.

At time T1, the switch 100 is turned when an enable signal 304 transitions from a low state to a high state and a Vgs detection signal 308 is at a low state. As a result, a gate boost signal 312 transitions from a low state to a high state and a gate current 320 through MP2 and MP4 is applied to the common gate 116. A voltage 324 between the common gate and the common source begins to rise. At time T2, the voltage 324 rises above the threshold required to turn on the NFETs MN1 and MN2. Thus, the clamp circuit 164 conducts current which causes the Vgs detection signal 308 to transition from a low state to a high state, thereby causing the gate boost signal 312 to transition from a high state to a low state, which disables the boost current circuit. As a result, the current 320 through MP2 and MP4 falls down to a steady state level which in some embodiments is approximately 10% of the boost current level. In this example, the mono-shot signal 328 transitions from a high state to a low state at time T1, remains in the low state for approximately 3 us and thereafter returns to its stable high state.

In one aspect, the PMOS source follower MPSF tracks the input voltage Vin, and in response generates a constant Vgs (i.e., VCAMP) as the sum of gate to source voltage (Vgs) of MPSF and drain to source voltage Vds of MN8. The voltage VCLAMP is applied between the common gate 116 and the common source 110. Using a constant VCLAMP over the entire range of Vin results in an accurate and a linear Ron over the entire operating range.

In another aspect, the FET MN8 is chosen having identical properties to MN1 and MN2. By matching MN8 with MN1 and MN2, process related errors resulting from changes in Vt (threshold voltage) are reduced. Furthermore, the back to back coupled MN1 and MN2 provide a safe operation in the event VDD and VSS are not present (i.e., 0 or floating). When Vin is applied, the output 122 remains isolated and there are no leakage paths to either VDD or VSS. Consider that VDD and VSS are not applied and Vin>VDD. In this case, the signal at the input 106 is not passed to the output 122 or to VDD because the body diode of MN1 acts as a reverse blocking diode. Now consider that VDD and VSS are not applied and Vin<VSS. In this case, the body diode of MN1 is forward biased but the body diode of MN2 is reverse biased, thereby blocking the signal at the input 106 from reaching the output 122.

Variations to the switch 100 within the scope of the disclosure are possible. For example, the clamp circuit 164 may utilize a variable resistor instead of the NFET MN8. If a variable resistor is utilized, the clamp voltage across the common gate 116 and the common source 110 is the sum of the voltage across the variable resistor and Vgs of the source follower MPSF. Also, a diode or multiple series coupled diodes, Vbe multiplier, or Vt multiplier may be utilized to couple the low voltage terminal 140 to the switch 100, and a diode may be utilized to couple the source 252 and the gate 256 of MN7.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain transistors are described herein, other equivalent devices may be used in place of or in connection with these transistors. For example, in some embodiments, bipolar transistors, diodes, metal oxide semiconductor field effect transistors may be used in place of or in connection with the devices described herein. Furthermore, n-type devices may be replaced with p-type devices and vice versa.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. An analog switch comprising:
   a first transistor having a first terminal coupled to an input voltage terminal, a second terminal coupled to a common source, and a control terminal coupled to a common gate;
   a second transistor having a first terminal coupled to an output voltage terminal, a second terminal coupled to the common source, and a control terminal coupled to the common gate;
   a current source having a first input adapted to be coupled to a first voltage supply, a control input coupled to receive a gate boost signal, and an output coupled to the common gate, the current source operable to supply a boost gate current to the common gate terminal during a boost period and to supply a reduced gate current after the boost period;
   a clamp circuit having a first terminal coupled to the common gate, a second terminal coupled to the common source, and a third terminal, the clamp circuit operable to apply a clamp voltage across the common gate and the common source; and
   a Vgs detection circuit having a first terminal coupled to the third terminal of the clamp circuit and having a second terminal adapted to be coupled to a second voltage supply, the Vgs detection circuit operable to provide the gate boost signal.

2. The switch of claim 1, wherein the gate boost signal has a logic low state when current conducts through the clamp circuit and has a logic high state in the absence of a conduction of current through the clamp circuit.

3. The switch of claim 1, wherein the current source is operable to supply the boost gate current to the common gate terminal responsive to the gate boost signal having a logic high state and is operable to remove the boost gate current responsive to the gate boost signal having a logic low state.

4. The switch of claim 1, wherein the current source is operable to supply the reduced current to the common gate terminal responsive to the gate boost signal having a logic low state.

5. The switch of claim 1, wherein the gate boost signal has a logic low state when the voltage across the common gate and the common source rises above the clamp voltage.

6. The switch of claim 1, further comprising:
a third transistor coupled between the common gate and the second voltage supply, the third transistor operable to connect the common gate to the second voltage supply when the third transistor is turned on and to disconnect the common gate from the second voltage supply when the third transistor is turned off; and
a fourth transistor coupled between the common source and the second voltage supply, the fourth transistor operable to connect the common source to the second voltage supply when the fourth transistor is turned on and to disconnect the common source from the second voltage supply when the fourth transistor is turned off.

7. The switch of claim 1, wherein the clamp circuit comprises:
an eighth transistor having a drain coupled to the common gate, a gate coupled to the drain, and a source; and
a source follower transistor having a source coupled to the source of the eighth transistor, a gate coupled to the common source, and a drain coupled to the Vgs detection circuit.

8. The switch of claim 1, wherein the current source comprises:
a first current mirror having a first terminal adapted to be coupled to receive a first reference current and a second terminal coupled to the second voltage supply, the first current mirror operable to provide a first mirrored current;
a second current mirror having a first terminal coupled to the first voltage supply and a second terminal coupled to receive the first mirrored current, the second current mirror operable to provide the gate current;
a seventh transistor having a source coupled to the first current mirror, a drain coupled to the second current mirror, and a gate adapted to be coupled to receive an enable signal, the seventh transistor operable to couple the first current mirror to the second mirror responsive to the enable signal; and
a boost current circuit having a first terminal coupled to the drain of the seventh transistor, a second terminal adapted to be coupled to receive the first reference current, and a third terminal coupled to the second voltage supply.

9. The switch of claim 1, wherein the boost current circuit comprises:
a lower transistor having a gate coupled to receive the first reference current, a drain, and a source coupled to the second voltage supply; and
an upper transistor having a gate coupled to receive the gate boost signal, a drain coupled to the second current mirror, and a source coupled to the drain of the lower transistor.

10. The switch of claim 1, wherein the Vgs detection circuit comprises:

a current mirror having a first terminal couped to the drain of the source follower transistor, a second terminal coupled to the second voltage supply, and a third terminal; and
an inverter having an input coupled to the third terminal of the current mirror and an output configured to provide a Vgs detect signal.

11. The switch of claim 10, wherein the Vgs detection circuit comprises a mono-shot circuit having an input coupled to receive the enable signal, the mono-shot circuit operable to provide a mono-shot signal.

12. The switch of claim 11, wherein the Vgs detection circuit comprises a logic NOR gate having a first input coupled to receive the mono-shot signal and a second input coupled to receive the Vgs detect signal, the logic NOR gate operable to provide the gate boost signal.

13. An analog switch comprising:
a first field effect transistor (FET) having a first terminal coupled to an input voltage terminal, a second terminal coupled to a common source, and a control terminal coupled to a common gate;
a second FET having a first terminal coupled to an output voltage terminal, a second terminal coupled to the common source, and a control terminal coupled to the common gate;
a current source having a first input adapted to be coupled to a first voltage supply, a control input coupled to receive a gate boost signal, and an output coupled to the common gate, the current source operable to supply a boost gate current to the common gate during a boost period and to supply a reduced gate current during a second period different than the boost period;
a third FET adapted to be coupled between the common gate and a second voltage supply;
a fourth FET adapted to be coupled between the common source and the second voltage supply;
a clamp circuit having a first terminal coupled to the common gate, a second terminal coupled to the common source, and a third terminal, the clamp circuit operable to apply a clamp voltage between the common source and the common gate; and
a Vgs detection circuit having a first terminal coupled to the third terminal of the clamp circuit, a second terminal adapted to be coupled to the second voltage supply, the Vgs detection circuit operable to provide the gate boost signal responsive to the conduction of current through the clamp circuit.

14. The switch of claim 13, wherein the clamp circuit biases gate to source voltages of the first and second FETs to enhance an on resistance flatness of the analog switch.

15. The switch of claim 13, wherein the clamp circuit conducts current when the voltage across the common gate and the common source is greater than a threshold voltage required to turn on the first and second FETs.

16. The switch of claim 13, wherein the current source supplies the boost gate current to the common gate terminal responsive to the gate boost signal having a logic high state.

17. The switch of claim 13, wherein the current source supplies the reduced current to the common gate terminal responsive to the gate boost signal having a logic low state.

18. The switch of claim 13, wherein the gate boost signal has a logic high state when the voltage across the common gate and the common source is less than a threshold voltage required to turn on the first and second FETs.

19. The switch of claim 13, wherein the gate boost signal has a logic low state if the voltage across the common gate and the common source rises above a threshold voltage required to turn on the first and second FETs.

20. The switch of claim 13, wherein the Vgs detection circuit comprises:
   a current mirror having a first terminal couped to the drain of the source follower PFET, a second terminal coupled to the second voltage supply, and a third terminal; and
   an inverter having an input coupled to the third terminal of the current mirror and an output configured to provide a Vgs detect signal.

21. The switch of claim 13, wherein the Vgs detection circuit comprises a mono-shot circuit having an input coupled to receive the enable signal, the mono-shot circuit operable to provide a mono-shot signal.

22. The switch of claim 13, wherein the Vgs detection circuit comprises a logic NOR gate having a first input coupled to receive the mono-shot signal and a second input coupled to receive the Vgs detect signal, the logic NOR gate operable to provide the gate boost signal.

* * * * *